United States Patent
Tsai

(10) Patent No.: US 8,226,346 B2
(45) Date of Patent: Jul. 24, 2012

(54) SYSTEM AND METHOD FOR INSPECTING CHIPS IN A TRAY AND TRAY HANDLING APPARATUS THEREOF

(75) Inventor: Cheng Tao Tsai, Hsinchu County (TW)

(73) Assignee: Cheng Mei Instrument Technology Co., Ltd., Hsinchu County (TW)

( * ) Notice: Subject to any disclaimer, the term of this patent is extended or adjusted under 35 U.S.C. 154(b) by 688 days.

(21) Appl. No.: 12/391,580

(22) Filed: Feb. 24, 2009

(65) Prior Publication Data

US 2009/0214326 A1    Aug. 27, 2009

(30) Foreign Application Priority Data

Feb. 26, 2008    (TW) ................................ 97106570 A

(51) Int. Cl.
*B65H 3/24* (2006.01)

(52) U.S. Cl. ................. 414/797.5; 414/795.7; 414/795.6

(58) Field of Classification Search .................... 118/54;
134/57, 16, 21; 221/221, 241, 242; 269/226,
269/227; 271/221, 222, 223; 294/119.1;
414/222.07, 222.1, 222.12, 223.01, 226.01,
414/779, 788.2, 288.9, 789, 789.1, 792.2,
414/792.3, 795.6, 797.4, 797.5, 797.9, 798,
414/936; 901/46, 47

See application file for complete search history.

(56) References Cited

U.S. PATENT DOCUMENTS

| | | | | |
|---|---|---|---|---|
| 1,350,393 A * | 8/1920 | Parker | .................. | 414/798.5 |
| 2,453,545 A * | 11/1948 | Simpson | ..................... | 414/797.5 |
| 4,103,232 A * | 7/1978 | Sugita et al. | ................ | 324/750.2 |
| 4,750,538 A * | 6/1988 | du Quesne | .................... | 157/1.24 |
| 5,484,062 A * | 1/1996 | Rich | .............................. | 209/587 |
| 5,878,484 A * | 3/1999 | Araya et al. | ..................... | 29/740 |
| 6,241,459 B1 * | 6/2001 | Canella et al. | ............. | 414/798.1 |
| 6,483,102 B1 * | 11/2002 | Gune et al. | ..................... | 250/221 |
| 6,541,747 B1 | 4/2003 | Kikuchi et al. | | |
| 2007/0148792 A1 | 6/2007 | Marx et al. | | |
| 2007/0257412 A1 * | 11/2007 | Bonacini | ....................... | 269/227 |
| 2009/0214326 A1 * | 8/2009 | Tsai | ........................... | 414/788.9 |

OTHER PUBLICATIONS

Office Action issued on Feb. 20, 2012 for the Taiwanese counterpart application 097106570.

* cited by examiner

*Primary Examiner* — Gregory Adams
(74) *Attorney, Agent, or Firm* — WPAT, P.C.; Anthony King

(57) ABSTRACT

A tray handling apparatus comprises a plurality of guides, a chuck device, a linear movement device, and a rack and pinion device. A space defined by the erected guides is used to hold a tray stack. The chuck of the chuck device is located at the center position of the bottom area of the space. The linear movement device is used to move the chuck relative to the guides. The rack and pinion device is used to cause the guides to move symmetrically. When an operator moves any one of the guides, the other guides move symmetrically and the center of the bottom area of the space surrounded by the guides remains at the same location during the movement of the guides. The operator does not need to adjust the position of the chuck if the positions of the guides are changed.

15 Claims, 9 Drawing Sheets

SYSTEM AND METHOD FOR INSPECTING CHIPS IN A TRAY AND TRAY HANDLING APPARATUS THEREOF

BACKGROUND OF THE INVENTION

1. Field of the Invention

The present invention relates to a system for inspecting chips, and more particularly, to a system for inspecting chips in a tray and a tray handling apparatus thereof.

2. Description of the Related Art

The requirements of high mobility and high performance for electronic devices are driving forces for progressing the integrated circuit packaging technology such that the compact packaging technologies such as COG (Chip on Glass) packaging have become more and more popular. When the COG packaging technology is applied, the chips are examined and processed in trays, and the equipment used in the COG packaging process must have tray handling and transporting capabilities.

Trays for receiving chips are generally available in sizes of 2, 3, and 4 inches. If trays of all three sizes are to be received, the tray handling apparatus must be adjustable to fit all of the sizes. FIG. 1 illustrates an adjusting mechanism of a prior art tray handling apparatus for accommodating trays of different sizes. As shown in FIG. 1, when smaller trays are to be used, the guides 101-104 must be adjusted to change the size of the space defined by the guides 101-104 to fit the size of the trays. When the prior art tray handling apparatus is adjusted, the guide 101 and the guide 102 are moved toward one another along the x-direction, and the guide 103 and the guide 104 are respectively moved along diagonal directions of the space until the size of the space fits the size of the tray. The guides 101-104 are moved independently so that the adjustment of the space is not convenient for a user. After the guides 101-104 are adjusted, the chuck 105 is misaligned with the center position of the bottom area of the adjusted space, and the position of the chuck 105 must be adjusted; otherwise it will not work properly. The misalignment problem is more serious when the space for a 4-inch tray is adjusted to the space for a 2-inch tray. Usually, the mechanism for adjusting the chuck position is inside the equipment and is difficult to access and manipulate by an operator.

Moreover, the differences in tray thickness also challenge the usability of the chuck device of a prior art equipment. The up-and-down movement of the chuck of a prior art equipment is driven by a pneumatic cylinder. Because the stroke of a pneumatic cylinder is fixed, the loading or unloading of trays with different thicknesses to or from the chuck may cause problems.

The present invention proposes a tray handling solution that can be easily adjusted and used for trays with different thicknesses, to resolve the above problems of the chip packaging industry.

SUMMARY OF THE INVENTION

According to one embodiment, the present invention proposes a tray handling apparatus, which comprises a plurality of guides, a chuck device, a plurality of linear movement devices, and a rack and pinion device. The plurality of guides are erected relative to a horizontal surface, wherein the guides define a space that is configured to accommodate stacked trays. The chuck device comprises a chuck and is configured to move the stacked trays vertically, wherein the chuck is disposed at a center position of a bottom area of the space. The plurality of linear movement devices are disposed corresponding to the guides, wherein each linear movement is disposed substantially orthogonal to the corresponding guide and is configured to move the corresponding guide to change a distance between the guide and the chuck. The rack and pinion device is coupled to the linear movement devices and configured to move the guide symmetrically.

According to another embodiment, the present invention proposes a tray handling apparatus, which comprises a tray guide mechanism and a chuck device. The tray guide mechanism comprises a plurality of guides erected on a horizontal surface, wherein the guides define a space that is configured to accommodate stacked trays. The chuck device comprises a chuck and is configured to move the stacked trays vertically, wherein the chuck is disposed at a center position of a bottom area of the space, and the guides move symmetrically relative to the chuck so that the space can be enlarged or shrunk symmetrically.

The present invention proposes a system for inspecting the surfaces of chips in a tray, which comprises a first tray handling apparatus, a three-dimensional sensor, an image sensor, and a second tray handling apparatus, wherein the first tray handling apparatus and the second tray handling apparatus are any one of the above-described tray handling apparatuses. The first tray handling apparatus is configured to provide stacked trays for processing. The three-dimensional sensor is configured to provide height information for a surface of a chip in a tray. The image sensor is configured to inspect the surface of the chip, wherein the image sensor performs focusing based on the height information of the surface before inspection. The second tray handling apparatus is configured to receive a tray carrying chips that have passed surface inspection.

The present invention proposes a method for inspecting the surfaces of chips in a tray, which comprises the steps of: moving a tray from a first tray handling apparatus to a first place where a three-dimensional sensor performs measurement; measuring height information for each chip in the tray by the three-dimensional sensor; moving the tray to a second place where an image sensor performs inspection; inspecting a surface of each chip; moving each defective chip to a tray for receiving defective chips located at a designated area, then moving the tray to a second tray handling apparatus; and moving the tray to a third tray handling apparatus after each defective chip is removed from the tray; wherein the first tray handling apparatus and/or the second tray handling apparatus comprise a tray guide mechanism that includes a plurality of guides; the guides define a space having a central axis parallel to the guides; and the guides move symmetrically relative to the central axis so that the space can be enlarged or reduced symmetrically.

BRIEF DESCRIPTION OF THE DRAWINGS

The invention will be described according to the appended drawings in which.

PREFERRED EMBODIMENT OF THE PRESENT INVENTION

Figure 1:
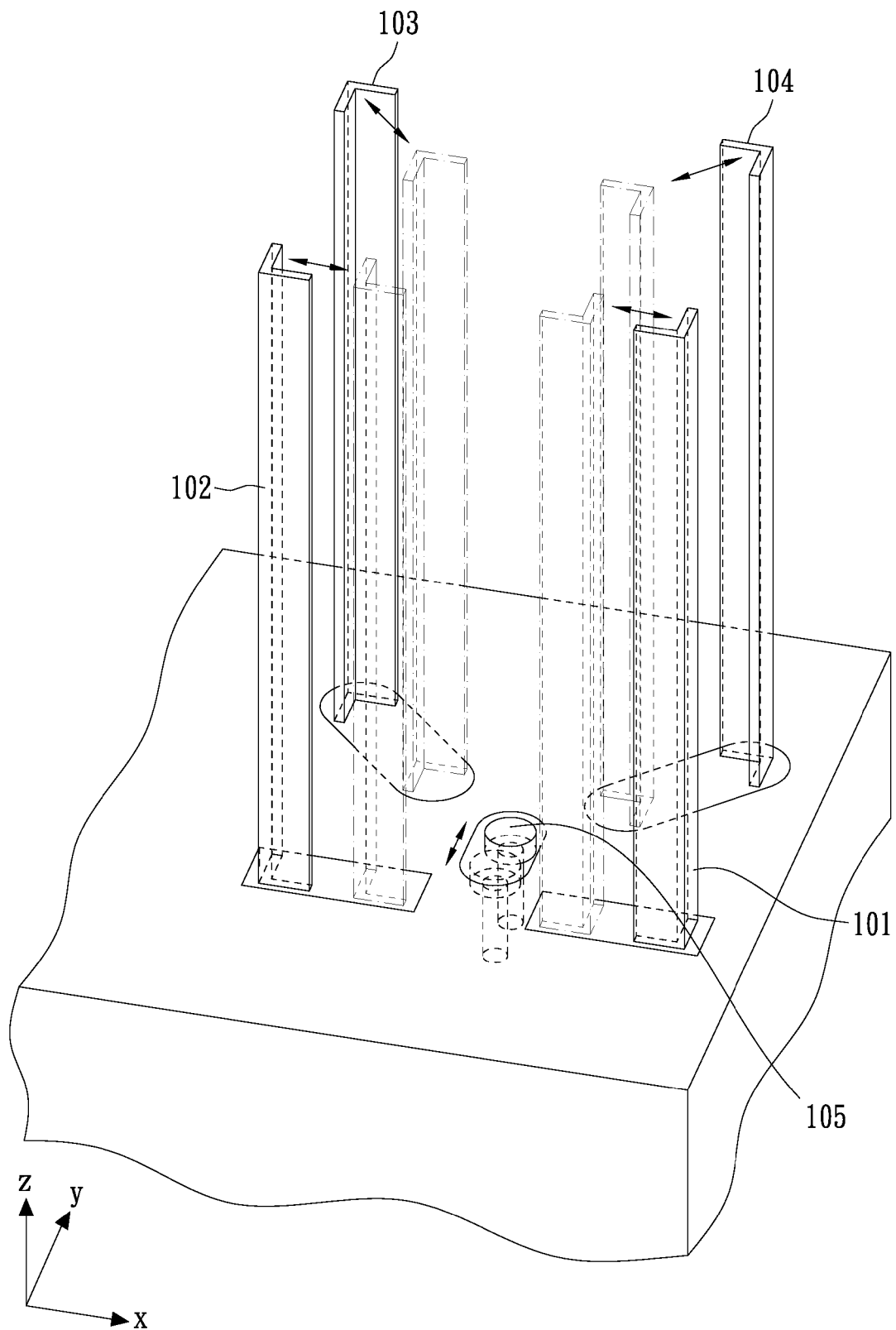
FIG. 1 illustrates an adjusting mechanism of a prior art tray handling apparatus for accommodating trays of different sizes.
Figure 2:
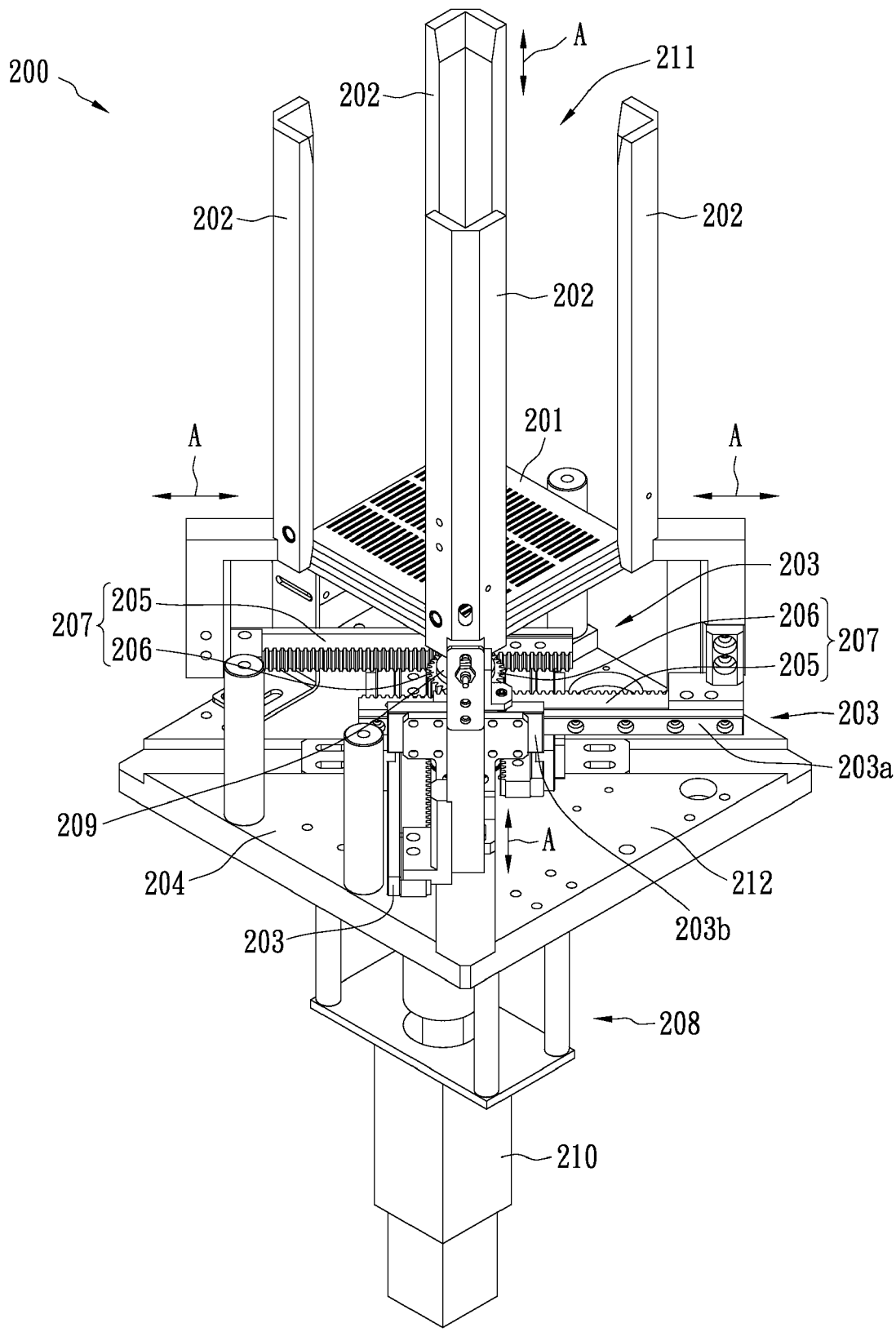
FIG. 2 shows a tray handling apparatus according to one embodiment of the present invention.

FIG. 2 shows a tray handling apparatus 200 according to one embodiment of the present invention. A tray stack 201 is received within the space 211 defined by a plurality of guides 202, each of which has an L-shaped cross-section. The guides 202 are erected relative to a horizontal surface 212 and are disposed around the corners of the tray stack 201. The size of the bottom area of the space is slightly larger than the size of the stacked trays. A plurality of linear movement devices 203, corresponding to the guides 202, are attached to a base 204. Each linear movement device 203 is disposed substantially orthogonal to the corresponding guide 202 so that each guide 202 can move along a respective direction (shown by arrow A). In the present embodiment, the linear movement device 203 comprises a slide-rail assembly. A rack and pinion device 207 is coupled to the linear movement devices 203 so that when one guide 202 is moved by a distance, the other guides 202 will simultaneously move the same distance. The rack and pinion device 207 comprises a plurality of rack bars 205 disposed on the linear movement devices' 203 inward-facing surfaces and a rack gear 206 disposed below the center position of the bottom area of the space 211, wherein the rack bars 205 engage the rack gear 206.

The tray stack 201 is moved vertically by a chuck device 208. In the present embodiment, the chuck device 208 comprises a chuck 209 and a servomotor 210. The loading and unloading of trays from the tray stack 201 is achieved by the up-and-down movement of the chuck 209, which is driven by the servomotor 210. The servomotor 210 can be controlled to move any distance so that the chuck device 208 can handle trays of any thickness.

Figure 3:
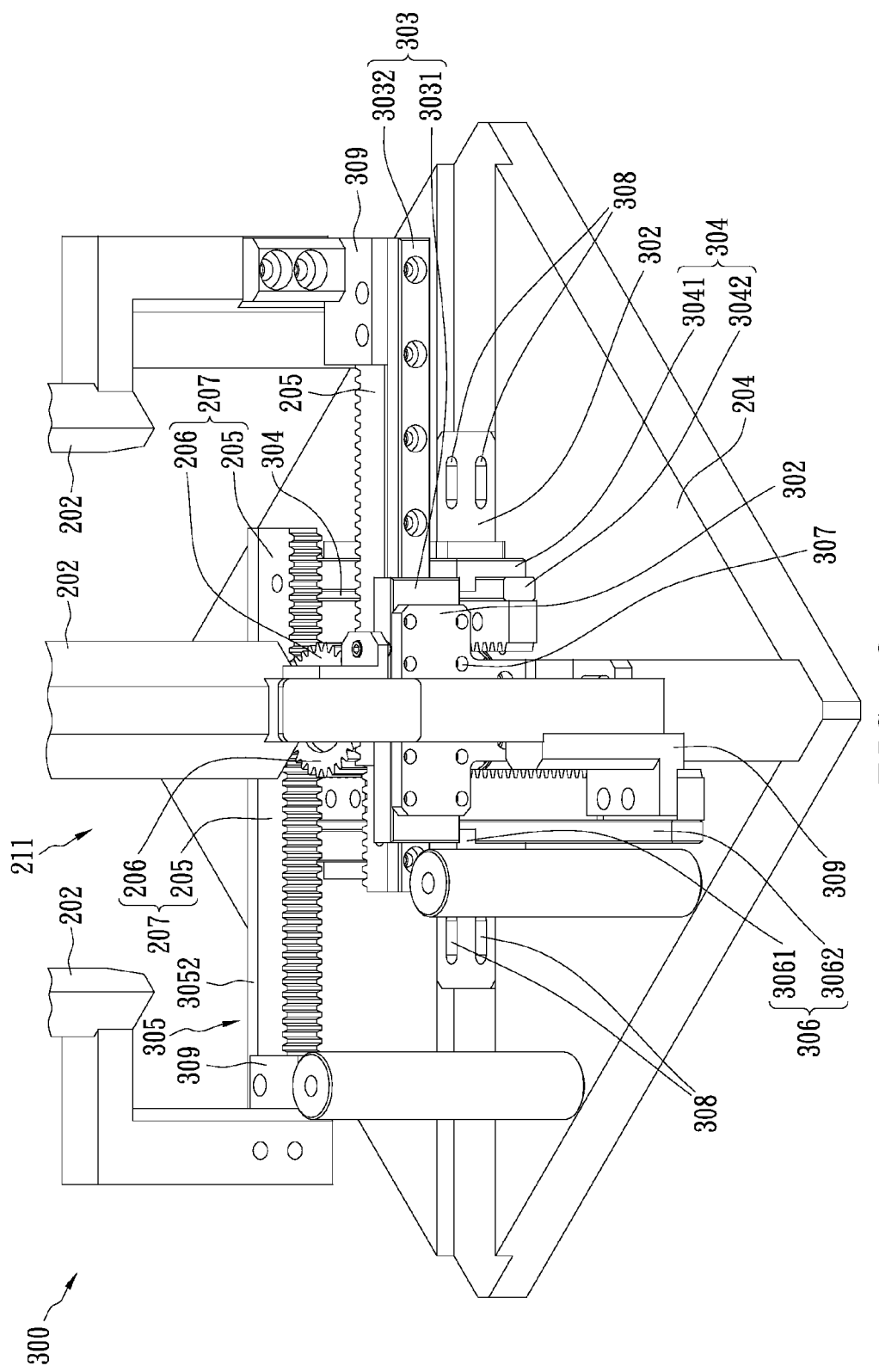
FIG. 3 shows a tray guide mechanism according to one embodiment of the present invention.

FIG. 3 shows a tray guide mechanism 300 according to one embodiment of the present invention. The guides 202 are disposed with respect to the corners of the base 204. The guides 202 are attached to the corresponding linear movement devices 303-306 and are able to move along the corresponding diagonal directions of the base 204. Each linear movement device 303-306 comprises a guide member 3031-3061 and a rail 3032-3062 (the guide member 3051 is not shown in FIG. 3). The guide member 3031 is fixed by an L-shaped holding element 302. The guide member 3031 is fastened to the L-shaped holding element 302 through holes 307. The L-shaped holding element 302 is fastened to the base 204 through two elongated holes 308. The linear movement devices 304-306 are fixed in a way similar to that described above. The rails 3032-3062 are held by and are able to slide on the corresponding guide members 3031-3061, and are spaced-apart from the diagonal lines of the base 204 by a predetermined distance respectively.

The linear movement devices 303-306 are disposed in pairs. The linear movement devices 303-306 in each pair are in parallel and disposed on a corresponding surface parallel to the horizontal surface 212 (as shown in FIG. 2). For example, the linear movement device 303 and the linear movement device 305 are formed as a pair, and the linear movement device 304 and the linear movement device 306 are formed as another pair of the linear movement devices 303-306. Different pairs of the linear movement devices 303-306 overlap with one another, and the linear movement devices 303-306 between the different pairs are arranged substantially orthogonally. For example, the pair of the linear movement device 303 and the linear movement device 305 is disposed on the pair of the linear movement device 304 and the linear movement device 306, and the longitudinal direction of the linear movement device 303 or the linear movement device 305 is substantially orthogonal to the longitudinal direction of the linear movement device 304 and the linear movement device 306. Such an arrangement can avoid interference among the rails 3032-3062 while the rails 3032-3062 are moving.

The rack bars 205 are disposed on the rails' 3032-3062 surfaces that face inward. The guides 202 are connected to one end of the corresponding rack bars 205 by corresponding L-shaped connecting members 309. The locations of the guides 202 relative to the rack bars 205 are shifted due to the L-shaped connecting members 309 so that the guides 202 can move along the corresponding diagonal directions of the space 211. The rack gear 206 is disposed at the center of the base 204 and engages the rack bars 205. The rack gear 206 and the rack bars 205 are the primary parts of the rack and pinion device 207. Due to the cooperation of the rack gear 206 and the rack bars 205, the linear movement devices 303-306 can simultaneously and symmetrically move an equal distance. Also, due to the rack and pinion device 207, two parallel linear movement devices 303-306, for example the linear movement device 303 and the linear movement device 305 or the linear movement device 304 and the linear movement device 306, move in opposite directions. Using such an assembly as described, when the guides 202 are going to be moved to fit a size of a tray, one guide 202 is moved and the others are driven by the rack and pinion device 207, and the area defined by the guides 202 can be enlarged or reduced symmetrically and proportionally. An operator does not need to move the guides 202 separately. Moreover, the rack gear 206 is coaxial with the vertical centerline of the base 204. All of the guides 202 coupled by the rack gear 206 move the same distance toward or away from the vertical centerline of the base 204 so that the guides 202 always have the same vertical centerline. Because the vertical centerline of the guide 202 is not changed no matter how the guides moves, the chuck 209 does not need to be adjusted as the above described prior art apparatus requires.

Figure 4:
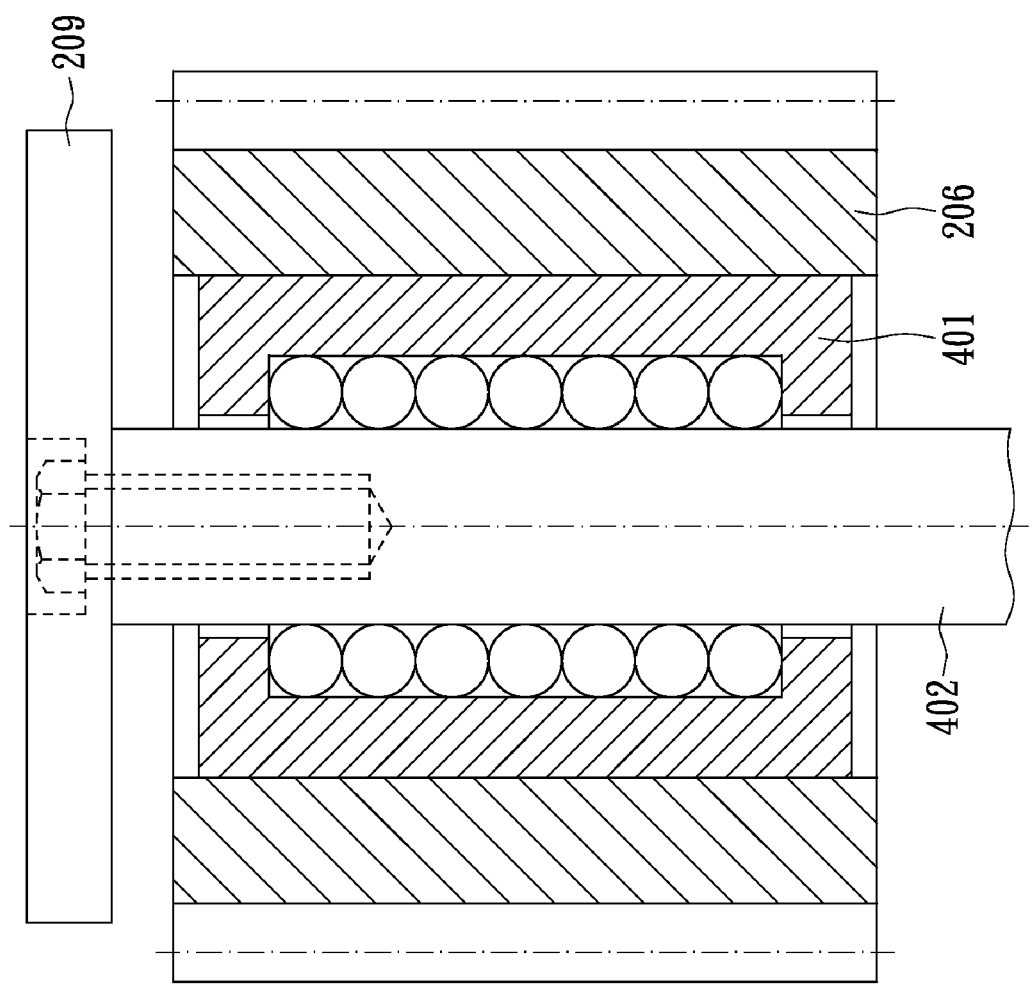
FIG. 4 is a cross sectional view showing the assembly of a rack gear, a bearing and a shaft according to one embodiment of the present invention.

FIG. 4 is a cross sectional view showing the assembly of a rack gear, a bearing and a shaft according to one embodiment of the present invention. The bearing 206 is embedded within the rack gear 401, and the shaft 402 is inserted through the bearing 206 so that the rack gear 401 can rotate about the shaft 402. The shaft 402 is configured to move the chuck 209 attached to one end of the shaft 402 up and down, and therefore the bearing 401 shall allow the shaft 402 to move linearly therein. In one embodiment, the bearing 401 comprises a linear ball bearing.

Figure 5:
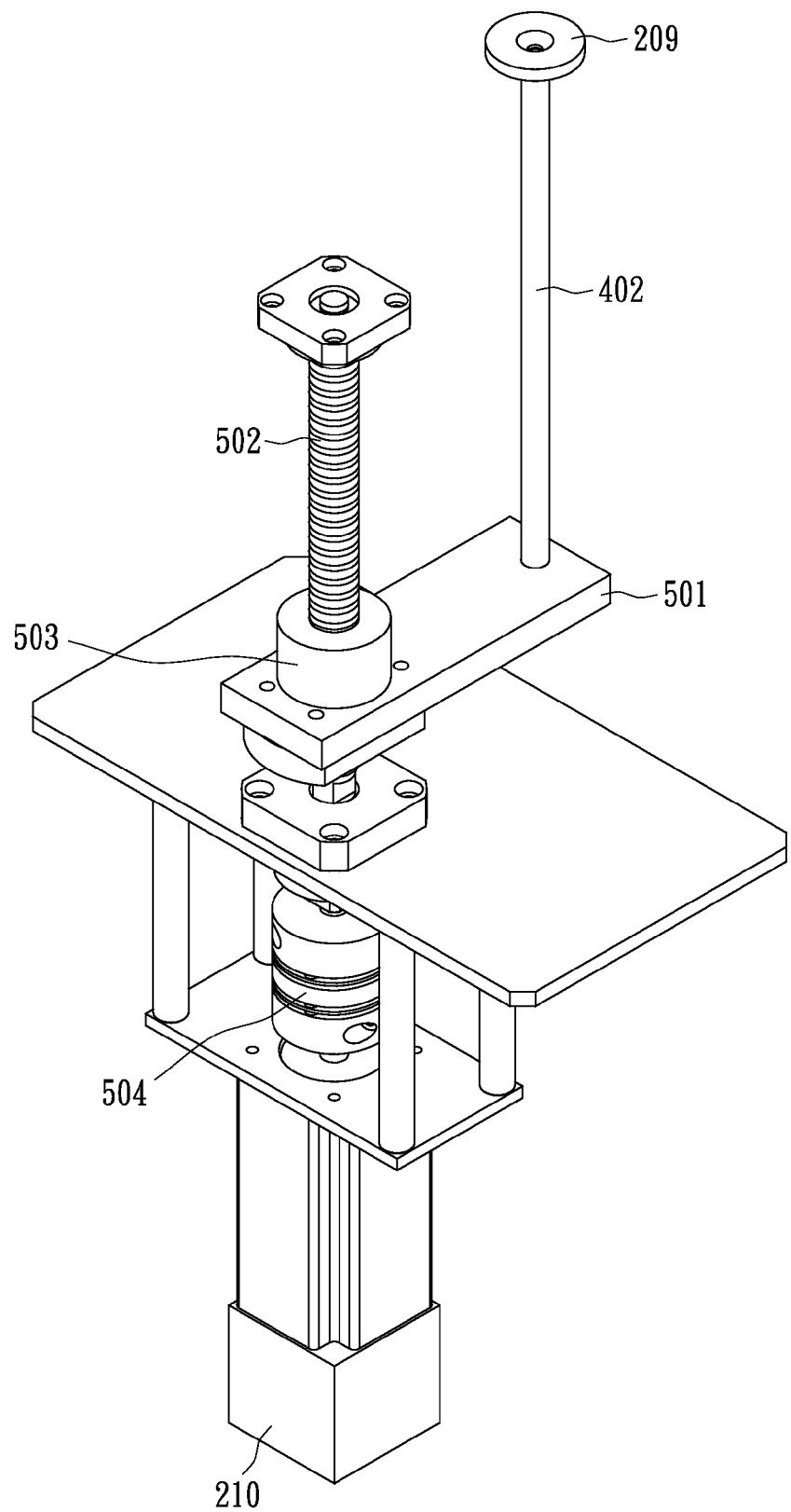
FIG. 5 shows a chuck device according to one embodiment of the present invention.

FIG. 5 shows a chuck device 208 according to one embodiment of the present invention. Referring to FIG. 4 and FIG. 5, the shaft 402 extends through the bearing 401 and attaches to one end portion of an extension plate 501. Another opposite end portion of the extension plate 501 is coupled to a nut 503 engaged with a lead screw 502. A coupling member 504 is used to attach a motor 210 to the lead screw 502. As the motor 210 rotates, the rotated coupling member 504 rotates the lead screw 502 and the nut 503 moves linearly up and down. When the nut 503 moves up and down, the chuck 209 supported by the shaft 402 moves up and down simultaneously. The motor 210 comprises a stepping motor or a servomotor. The chuck 209 can be moved any distance by controlling the motor 210 so that the moving pitch of the chuck 209 can be adjusted to meet the thickness of the tray in use. As a result, the chuck device 208 of the present invention can easily use trays of different thicknesses.

Figure 6A:
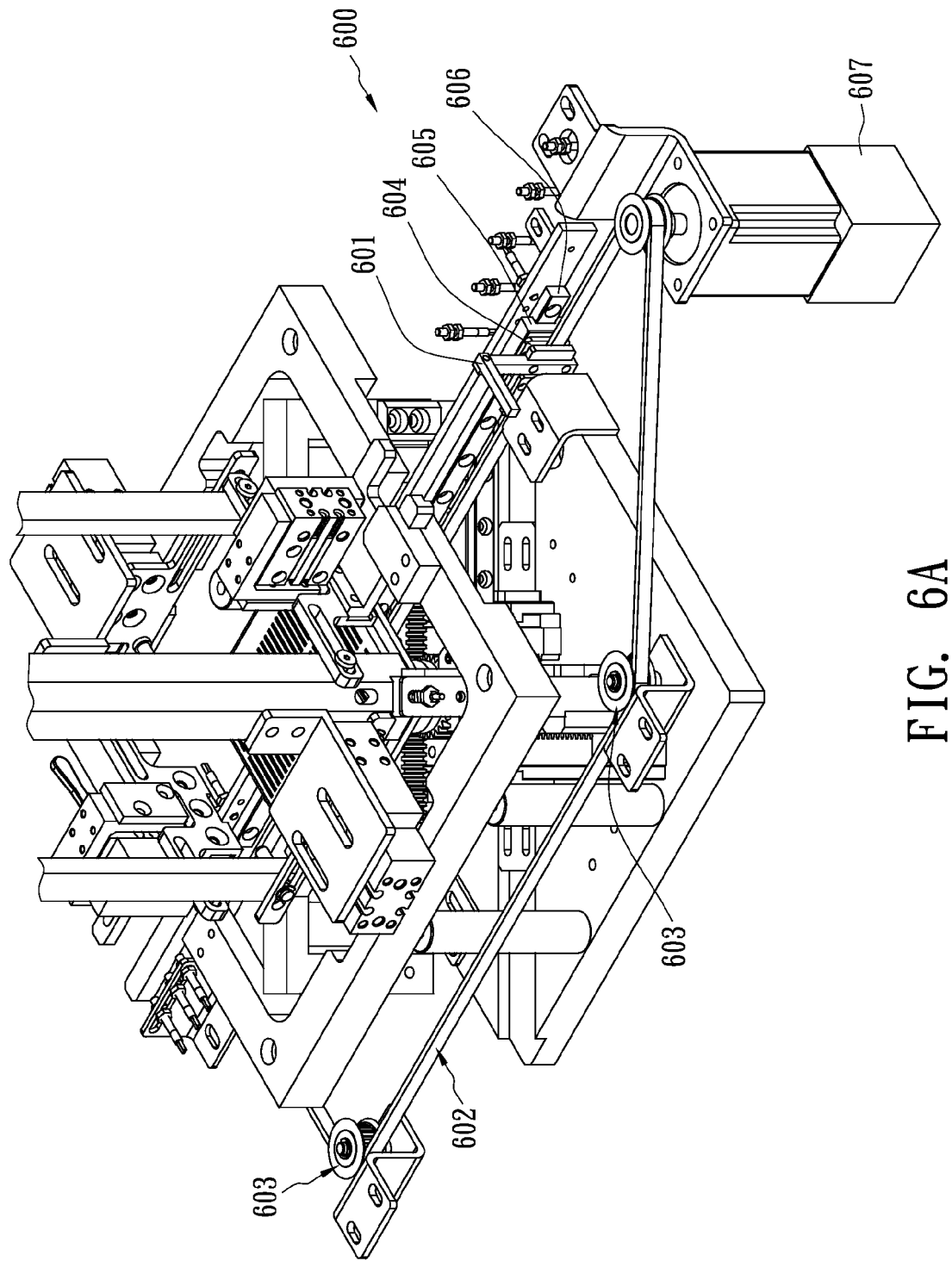
FIG. 6A shows a loading mechanism according to one embodiment of the present invention.

FIG. 6A shows a loading mechanism 600 according to one embodiment of the present invention. The loading mechanism 600 is configured to move a tray out of a tray loading device using a push rod 601, and the assembly of a timing belt 602 and a belt gear 603 drives the push rod 601. The push rod 601 is attached to a fixture member 604, and the timing belt 602 is placed in between the fixture member 604 and a slide element 605. When a motor 607 drives the timing belt 602, the push rod 601 moves along a rail 606 via the slide element 605.

Figure 6B:
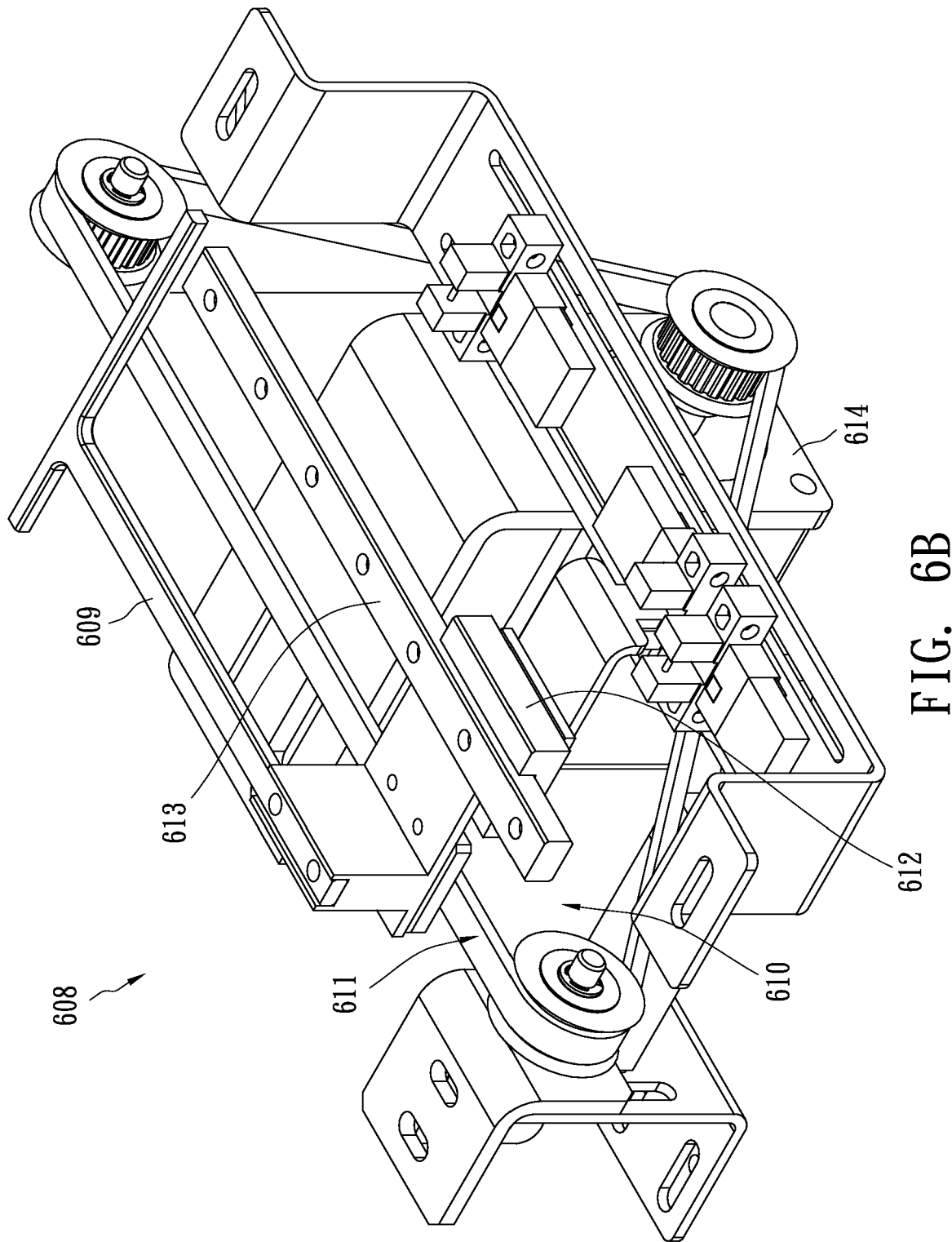
FIG. 6B shows an unloading mechanism according to one embodiment of the present invention.

FIG. 6B shows an unloading mechanism 608 according to one embodiment of the present invention. The unloading mechanism 608 is configured to move a processed tray into a tray unloading device using a push rod 609, and the push rod 609 is attached to a fixture member 610, which is coupled to a timing belt 611 and a slide element 612. When a motor 614 drives the timing belt 611, the push rod 609 moves along a rail 612 via the slide element 613.

Figure 7:
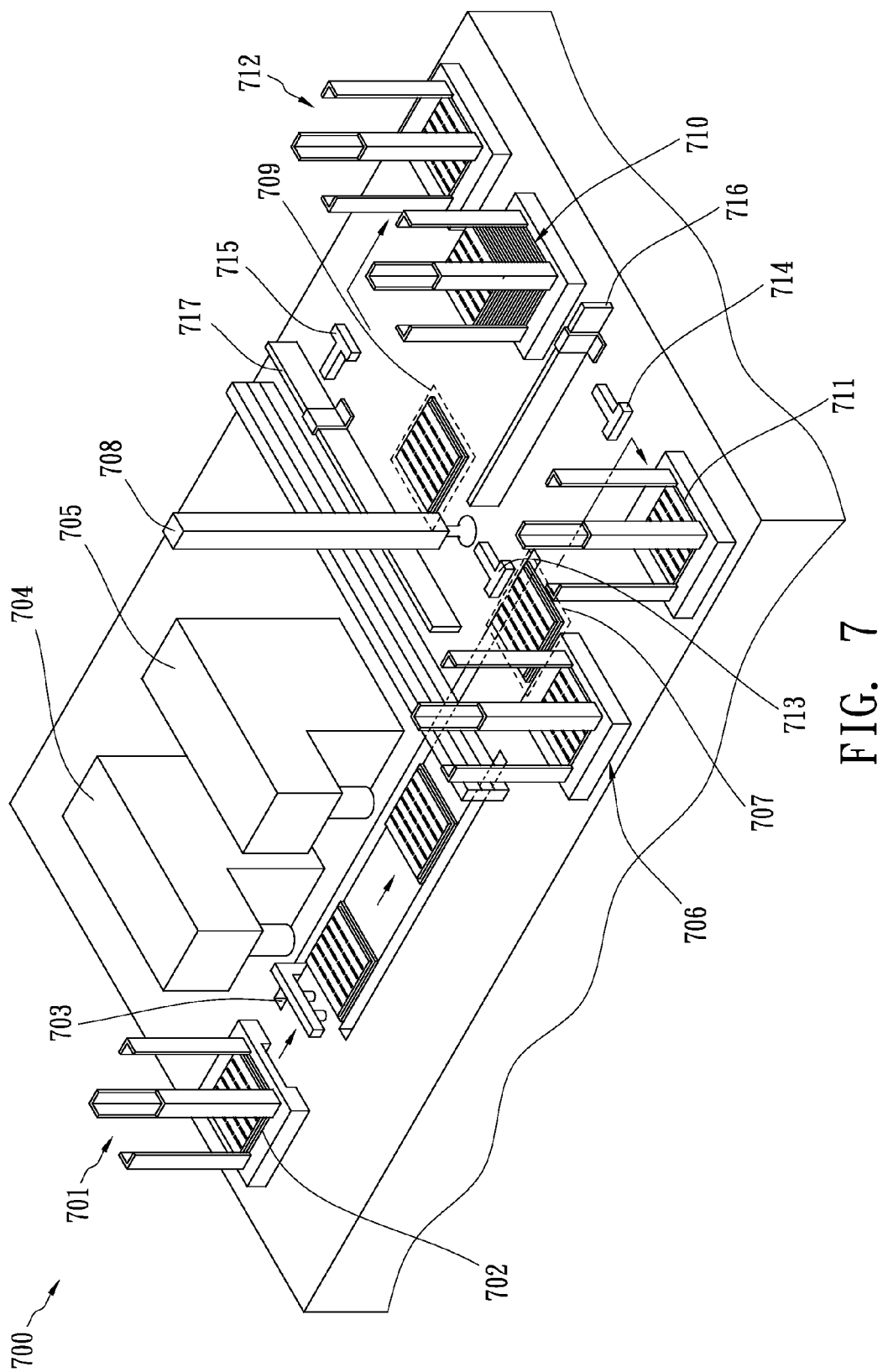
FIG. 7 shows a system for inspecting chips in a tray according to one embodiment of the present invention.

FIG. 7 shows a system 700 for inspecting chips in a tray according to one embodiment of the present invention. Referring to FIGS. 6A, 6B and 7, the system 700 for inspecting chips in a tray includes a set of tray handling means, which comprises a first tray handling apparatus 701, a second tray handling apparatus 706, a third tray handling apparatus 711, a fourth tray handling apparatus 712 and a tray provider 710. The first tray handling apparatus 701 is configured to provide stacked trays 702 with chips for inspection. The second tray handling apparatus 706 is configured to receive a tray carrying chips that have passed surface inspection. The third tray handling apparatus 711 is configured to receive a tray carrying chips that have passed surface inspection. The fourth tray handling apparatus 712 is configured to receive a tray carrying defective chips. The tray provider 710 is configured to provide an empty tray for receiving defective chips.

The method for inspecting chips in a tray initially adjusts the first tray handling apparatus 701, the second tray handling apparatus 706, and the third tray handling apparatus 711 to fit the size of processing trays in use, and then a stack of trays 702 is loaded into the first tray handling apparatus 701. Next, trays are serially moved out of the first tray handling apparatus 701 by the push rod 601 of a loading mechanism 600 as shown in FIG. 6A. During inspection, the trays are moved by a push bar mechanism 703 to a place under a three-dimensional sensor 704, and subsequently to a place under an image sensor 705. The push bar mechanism 703 applies a pushing force on the trays and causes the trays to move linearly. The push bar mechanism 703 is configured to move the trays from the first tray handling apparatus 701 to the second tray handling apparatus 706. The driving means of the push bar mechanism 703 can be a linear motor, or an assembly of a slide-rail mechanism, a timing belt and a motor. The three-dimensional sensor 704 is configured to provide height information for surfaces of chips in trays. The three-dimensional sensor 704 may be a chromatic sensor. The three-dimensional sensor 704 scans each chip in a tray and fetches signals relevant to the surface height of the chips in the tray, and then the signals are processed to obtain the height information of each chip in the tray. The image sensor 705 is configured to inspect the surface of each chip in a tray. At the start of surface inspection of each chip, the image sensor 705 is moved above the chip and then the height position of the image sensor 705 is adjusted based on the height information of the chip in order to perform focusing. After the image sensor 705 is focused on the surface of the chip, the inspection procedure is started. During surface inspection, the captured images are processed and the defects are identified, and the location of defective chips is recorded. If the tray carries only chips that have passed the inspection, the tray is moved to a place in front of the second tray handling apparatus 706 by the push bar mechanism 703 and the push rod 713 of the respective unloading mechanism 608 moves the tray into the second tray handling apparatus 706. If there are defective chips in a tray, the defective chips in the tray are removed at a chip pickup area 707. A chip pickup apparatus 708 moves defective chips from the tray at the chip pickup area 707 to a tray receiving defective chips disposed at a disqualified zone 709. The tray provider 710 provides the tray disposed at the disqualified zone 709. A plurality of stacked empty trays can be preloaded in the tray provider 710, and these empty trays are all for receiving defective chips. After all defective chips in the trays at the chip pickup area 707 are removed, the trays are moved to a place before the third tray handling apparatus 711 by a tray transport mechanism 716, and then the push rod 714 driven by a respective unloading mechanism 608 moves the trays into the third tray handling apparatus 711. When the tray for receiving defective chips at the disqualified zone 709 is full, the tray is moved before the fourth tray handling apparatus 712 by a tray transport mechanism 717, and the push rod 715 moves the tray into the fourth tray handling apparatus 712. Thereafter, an empty tray is moved from the tray provider 710. The tray transport mechanisms 716 and 717 are a type of linear movement apparatus and the driving means thereof can be a linear motor, or an assembly of a slide-rail mechanism, a timing belt and a motor.

Figure 8:
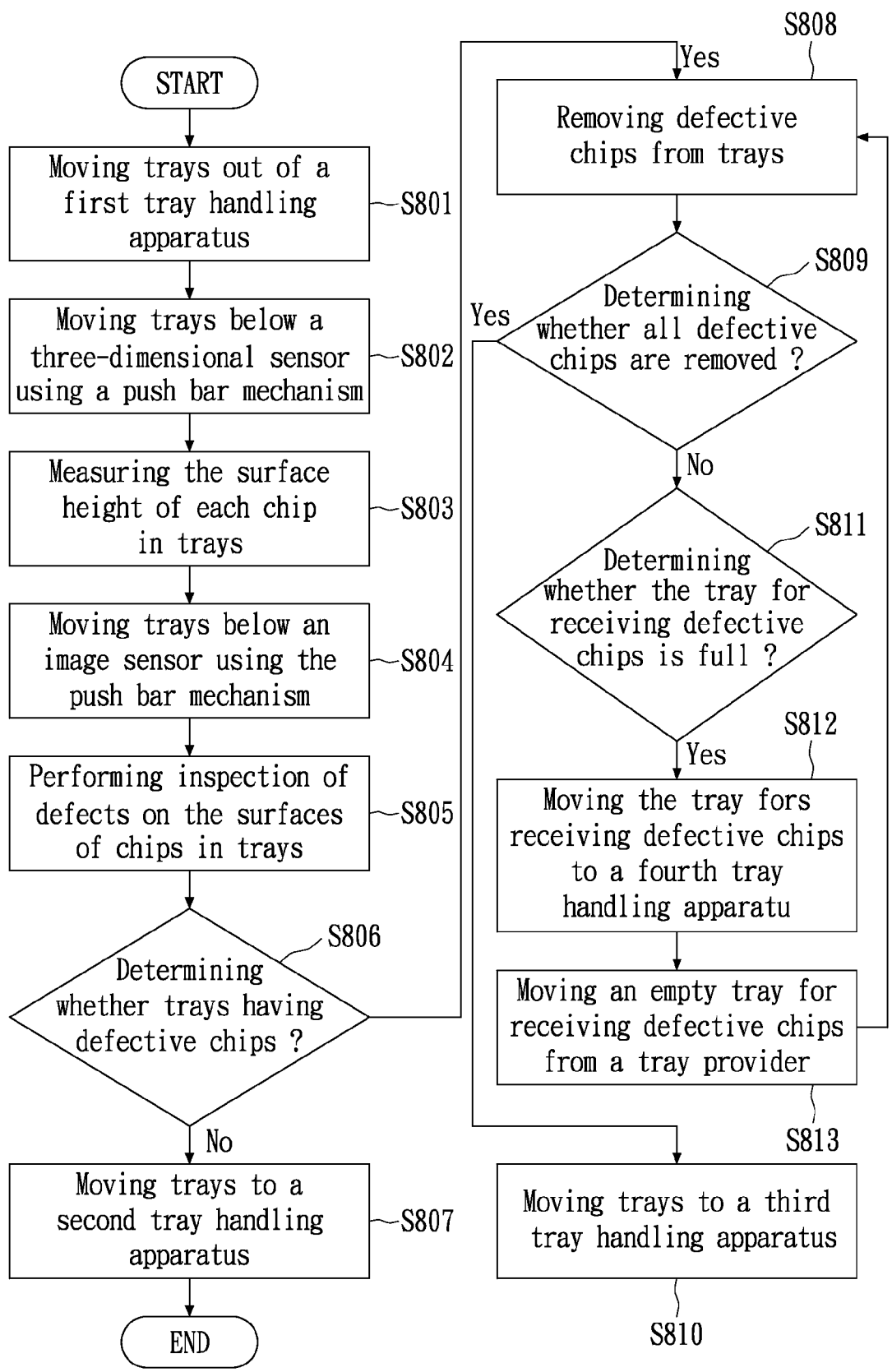
FIG. 8 is a flow chart showing the steps performed in the operation of inspection of chips in a tray according to one embodiment of the present invention.

FIG. 8 is a flow chart showing the steps performed in the inspection of chips in a tray according to one embodiment of the present invention. In step S801, trays are moved in series out of a first tray handling apparatus by a loading mechanism. In step S802, a push bar mechanism moves each of the trays below a three-dimensional sensor. In step S803, the three-dimensional sensor measures the height of the surface to be inspected of each chip in the trays. In step S804, the push bar mechanism moves each tray that has undergone chip surface height measurement below an image sensor. In step S805, based on the surface height information, the image sensor performs focusing and inspection of defects on the surfaces of the chips. The images obtained by the image sensor are analyzed, and the locations of defective chips are recorded. In step S806, the system determines whether the tray has defective chips or not. In step S807, if the tray has no defective chips, the tray is sent to a second tray handling apparatus. In step S808, if the tray includes defective chips, the defective chips are removed from the tray. In step S809, the system determines whether all defective chips have been removed. In step S810, after all defective chips have been removed, the tray is moved to the third tray handling apparatus. In step S811, the system determines whether the tray for receiving defective chips at a disqualified zone is full. In step S812, the tray for receiving defective chips is full and is moved to a fourth tray handling apparatus. In step S813, an empty tray for receiving defective chips is moved to the disqualified zone.

The above-described embodiments of the present invention are intended to be illustrative only. Numerous alternative embodiments may be devised by persons skilled in the art without departing from the scope of the following claims.

What is claimed is:

1. A tray handling apparatus, comprising:
a plurality of guides erected relative to a horizontal surface, wherein the guides define a rectangular space configured to accommodate stacked trays;
a chuck device comprising a chuck and configured to move the stacked trays vertically, wherein the chuck is disposed at a center position of a bottom area of the space, when the guides horizontally shift on the horizontal surface, and the chuck is disposed above the horizontal surface;
a plurality of linear movement devices disposed corresponding to the guides, wherein each linear movement device is disposed substantially orthogonal to a corresponding guide, each of the linear movement devices includes a guide member and a rail slidable on the guide member, the rail connects with the corresponding guide, and when the rail moves, the linear movement device is configured to move the corresponding guide to change a distance between the guide and the chuck; and
a rack and pinion device coupled to the linear movement devices and configured to move the guide symmetrically.

2. The tray handling apparatus of claim 1, wherein each linear movement device comprises a guide member and a rail slidable on the guide member.

3. The tray handling apparatus of claim 1, wherein the rack and pinion device comprises a plurality of rack bars and a rack gear.

4. The tray handling apparatus of claim 3, further comprising a bearing and a shaft, wherein the bearing is embedded within the rack gear and the shaft is inserted through the bearing.

5. The tray handling apparatus of claim 4, wherein the bearing is a linear ball bearing.

6. The tray handling apparatus of claim 1, wherein the chuck device further comprises:
a shaft having a first end and a second end, wherein the first end is attached to the chuck;
an extension plate;
a lead screw and a nut, wherein the nut engages the lead screw, the extension plate is coupled to the nut, and the shaft that is parallel to the longitudinal axis of the lead screw is attached to the extension plate by the second end thereof; and
a motor coupled to the lead screw assembly and configured to move the chuck vertically.

7. The tray handling apparatus of claim 6, wherein the motor is a stepping motor or a servomotor.

8. The tray handling apparatus of claim 1, wherein the linear movement devices are disposed in pairs, and the linear movement devices in each pair are in parallel and disposed on a corresponding surface parallel to the horizontal surface.

9. The tray handling apparatus of claim 8, wherein the pairs of the linear movement devices overlap with one another, and the linear movement devices between the different pairs are arranged substantially orthogonally.

10. The tray handling apparatus of claim 2, further comprising:
a base having a rectangular shape; and
a plurality of holding elements disposed corresponding to the rails, wherein the holding elements hold the corresponding rails on the base in directions parallel to the corresponding diagonal directions of the base.

11. The tray handling apparatus of claim 10, wherein the rack and pinion device comprises a plurality of rack bars corresponding to the rails, a rack gear, and a bearing wherein the rack bars are attached to the corresponding rails and coupled to the rack gear, and the bearing is embedded within the rack gear.

12. The tray handling apparatus of claim 11, wherein the bearing is a linear ball bearing.

13. The tray handling apparatus of claim 11, wherein the chuck device further comprises:
a shaft having a first end and a second end, wherein the first end is attached to the chuck;
an extension plate;
a lead screw and a nut, wherein the nut engages the lead screw, the extension plate is coupled to the nut, and the shaft that is parallel to the longitudinal axis of the lead screw is attached to the extension plate by the second end thereof; and
a motor coupled to the lead screw and configured to move the chuck vertically.

14. The tray handling apparatus of claim 10, wherein the linear movement devices are disposed in pairs; the linear movement devices of each pair are in parallel and disposed on a corresponding surface parallel to the horizontal surface; the pairs overlap with one another; and the linear movement devices in the different pairs are disposed substantially orthogonally.

15. The tray handling apparatus of claim 10, further comprising a plurality of L-shaped connecting members, wherein each L-shaped connecting member connects the corresponding guide to one end of the corresponding rack bar and causes the guide to move along a corresponding diagonal direction of the space.

* * * * *